United States Patent
Alrod et al.

(10) Patent No.: US 9,240,235 B2
(45) Date of Patent: Jan. 19, 2016

(54) MITIGATING DISTURB EFFECTS FOR NON-VOLATILE MEMORY

(71) Applicant: SANDISK TECHNOLOGIES INC., Plano, TX (US)

(72) Inventors: Idan Alrod, Herzliya (IL); Eran Sharon, Rishon Lezion (IL); Tz-Yi Liu, Palo Alto, CA (US); Tianhong Yan, Saratoga, CA (US); Menahem Lasser, Kohav-Yair (IL)

(73) Assignee: SANDISK TECHNOLOGIES INC., Plano, TX (US)

(*) Notice: Subject to any disclaimer, the term of this patent is extended or adjusted under 35 U.S.C. 154(b) by 41 days.

(21) Appl. No.: 14/135,294

(22) Filed: Dec. 19, 2013

(65) Prior Publication Data
US 2015/0179254 A1 Jun. 25, 2015

(51) Int. Cl.
G11C 8/00 (2006.01)
G11C 13/00 (2006.01)
(52) U.S. Cl.
CPC ........ G11C 13/0033 (2013.01); G11C 13/0035 (2013.01); G11C 13/0069 (2013.01)

(58) Field of Classification Search
USPC .................... 365/148, 230.03, 236
See application file for complete search history.

(56) References Cited

U.S. PATENT DOCUMENTS

| 6,005,810 | A | 12/1999 | Wu |
| 7,224,604 | B2 | 5/2007 | Lasser |
| 7,286,401 | B2 | 10/2007 | Ishimaru et al. |
| 2008/0144396 | A1* | 6/2008 | Chang et al. ............. 365/185.33 |
| 2013/0007353 | A1* | 1/2013 | Shim et al. ..................... 711/103 |
| 2014/0136765 | A1* | 5/2014 | Oh et al. ........................ 711/103 |

* cited by examiner

*Primary Examiner* — Hoai V Ho
(74) *Attorney, Agent, or Firm* — Toler Law Group, PC

(57) ABSTRACT

A method includes adjusting a counter value to indicate an access operation to a first portion of a non-volatile memory. The access operation is an erase operation or a write operation. The adjusted counter value indicates that a number of access operations to the first portion have been performed since an access operation to a second portion of the non-volatile memory has been performed. The method also includes selectively initiating a remedial action to the second portion in response to a comparison of the number of access operations to a threshold.

38 Claims, 3 Drawing Sheets

MITIGATING DISTURB EFFECTS FOR NON-VOLATILE MEMORY

FIELD OF THE DISCLOSURE

The present disclosure is generally related to mitigating disturb effects in non-volatile memory.

BACKGROUND

A popular non-volatile solid state memory in use today is flash memory (both NAND and NOR types). Flash memory is characterized by not being "write-symmetric" when writing data. To illustrate, each cell of a flash memory can be written from a value of "1" to a value of "0" independently of other cells. However, to change a cell back to a value of "1" a relatively large group of cells (called an "erase block") are set to a "1" value as a group. An erase group might contain hundreds of kilobytes or even several megabytes, and flash management systems that manage frequent updates of small chunks of data may implement relatively complex logic to preserve valid data that may be stored at other locations in the erase block.

In recent years several new "write-symmetric" non-volatile memory technologies have been introduced that do not have the non-symmetry as described for flash memory, such as Resistive RAM (also known as RRAM or ReRAM), and Magnetic RAM (also known as MRAM), as illustrative examples. In these technologies, a cell may be written in both directions—from "1" to "0" and from "0" to "1" without imposing a similar operation on cells that neighbor the cell being written.

Errors may occur in data stored into non-volatile memory devices, such as when a "target" block of a ReRAM experiences a relatively large number of program operations without program operations or erase operations being performed on a neighboring block. In such cases, data stored in the neighboring block may experience errors, referred to as "erase disturb." Error correction coding (ECC) may be used to correct erase disturb errors and other errors in data read from a non-volatile memory, up to a correction capability of an ECC scheme. Reducing a number of errors in data read from the non-volatile memory may improve read latency due to reduced ECC processing of the data, enable reduced complexity, power consumption, and cost associated with ECC processing circuitry, enable a longer useful life of the non-volatile memory device, or a combination thereof.

SUMMARY

A data storage device may use counters to track access operations to respective portions of a non-volatile memory. When the counter values indicate that a number of access operations to one portion of the non-volatile memory that have occurred since a last access to an adjacent portion of the non-volatile memory exceeds a threshold, a remedial action may be performed. The remedial action may reduce or prevent an accumulation of erase disturb effects in data stored at the non-volatile memory.

DETAILED DESCRIPTION

Particular embodiments of the present disclosure are described below with reference to the drawings. In the description, common features are designated by common reference numbers throughout the drawings.

Figure 1:
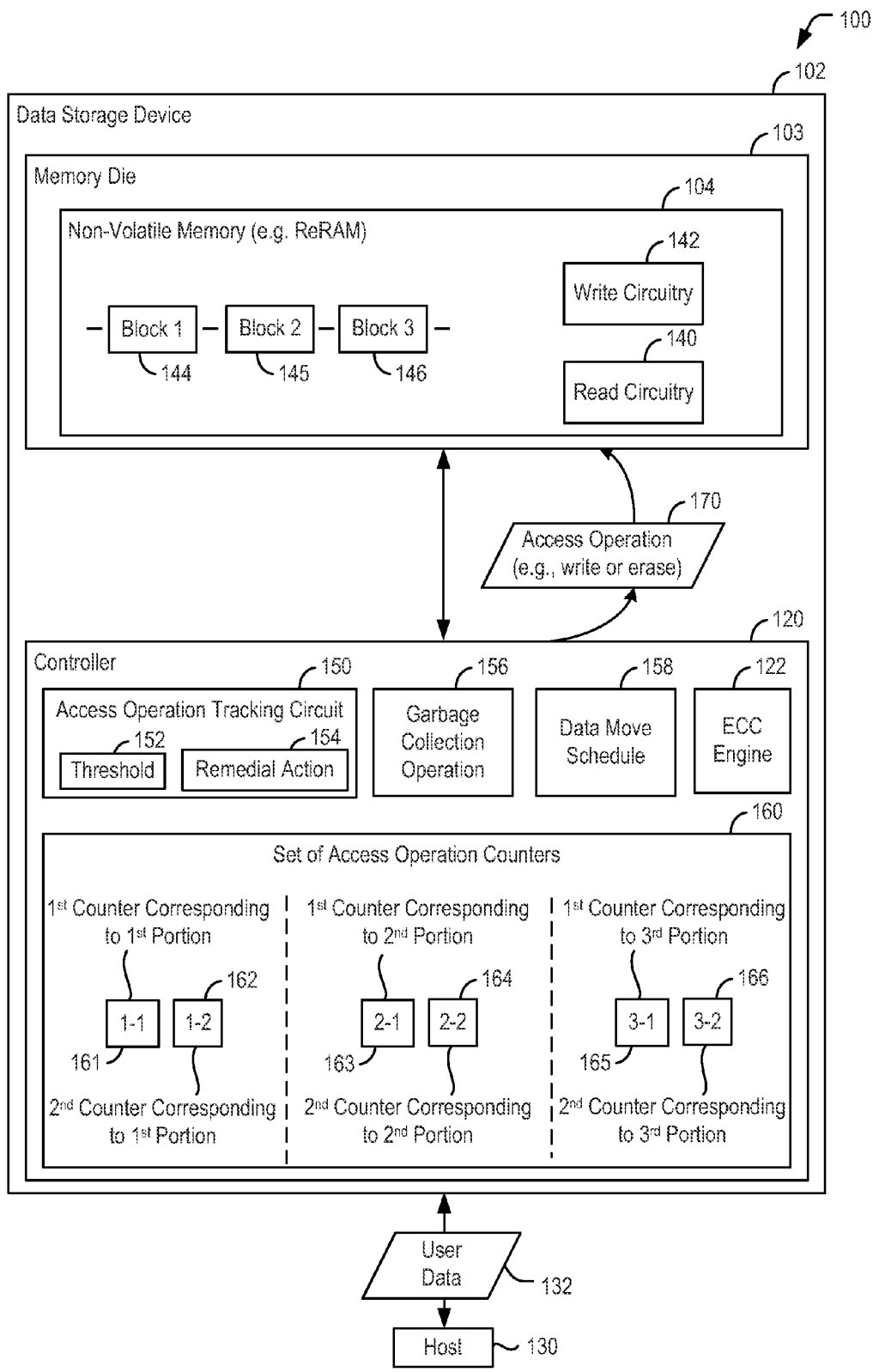
FIG. 1 is a block diagram of a particular illustrative embodiment of a system including a data storage device configured to mitigate disturb effects for a non-volatile memory.

Referring to FIG. 1, a particular embodiment of a system 100 that includes a data storage device 102 that is configured to track access operations to portions of a non-volatile memory, such as a ReRAM, and to perform a remedial operation to reduce erase disturbs, is depicted and generally designated 100. The data storage device 102 may be configured to mitigate disturb effects in a non-volatile memory.

The data storage device 102 may be coupled to a host device 130 via a communication path, such as a wired communication path and/or a wireless communication path. The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration.

The host device 130 may issue one or more commands to the data storage device 102, such as one or more requests to read data, such as the user data 132, from or write data to a memory of the data storage device 102. The host device 130 may include a mobile telephone, a music player, a video player, a gaming console, an electronic book reader, a personal digital assistant (PDA), a computer, such as a laptop computer, a notebook computer, or a tablet, any other electronic device, or any combination thereof. The host device 130 may communicate via a host controller, which may enable the host device 130 to read data from and to write data to the data storage device 102. The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification, as an illustrative, non-limiting example. The host device 130 may communicate with the data storage device 102 in accordance with another communication protocol.

To further illustrate, the data storage device 102 may be configured to be coupled to the host device 130 as embedded memory, such as in connection with an eMMC configuration, as an illustrative, non-limiting example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The data storage device 102 includes a controller 120 and a non-volatile memory 104. The controller 120 may be coupled to the non-volatile memory 104 via a bus, an interface, another structure, or a combination thereof. The non-volatile memory 104 may include a resistive random-access memory (ReRAM), another type of memory, or a combination thereof.

The non-volatile memory 104 may be on a memory die 103 that is separate from the controller 120 and that is coupled to the controller 120 via a bus. However, in other implementations, the non-volatile memory 104 and the controller 120 may be on a common die. The non-volatile memory 104 includes a memory such as a resistive random access memory (ReRAM) that can write data to individual storage elements by changing a stored data value of "1" to "0" (e.g., a "set" operation that changes the storage element from a first state to a second state) or by changing a stored data value of "0" to "1" (e.g., a "reset" operation that changes the storage element from the second state to the first state). Read circuitry 140 and write circuitry 142 are coupled to the non-volatile memory 104 and are configured to enable operations of reading data from storage elements of the non-volatile memory 104 and writing data to storage elements of the non-volatile memory 104, respectively.

The non-volatile memory 104 includes multiple adjacent portions of the memory, such as a first portion 144, a second portion 145, and a third portion 146. Each of the portions 144-146 may correspond to a block of the non-volatile memory 104. For example, the first portion 144 may correspond to a first block (block 1), the second portion 145 may correspond to a second block (block 2), and the third portion 146 may correspond to a third block (block 3). Although three representative portions 144-146 are illustrated, in other embodiments any number of portions may be in the non-volatile memory 104.

The controller 120 is configured to receive data and instructions from and to send data to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 includes an ECC engine 122 that is configured to receive data to be stored to the non-volatile memory 104 and to generate a codeword. For example, the ECC engine 122 may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder configured to decode data read from the non-volatile memory 104 to detect and correct, up to an error correction capability of the ECC scheme, any bit errors that may be present in the data.

The controller 120 includes an access operation tracking circuit 150 and a set of access operation counters 160. The access operation tracking circuit 150 is configured to track access operations to the portions 144-146 of the non-volatile memory 104. For example, the access operation tracking circuit 150 may be configured to adjust a counter value of a counter in the set of access operation counters 160 to indicate an access operation 170 to a particular portion of the non-volatile memory 104. To illustrate, when the access operation 170, such as a write operation or an erase operation, is directed to the second portion 145, the access operation tracking circuit 150 may adjust a value of one or more counters of the set of access operation counters 160 to indicate a number of accesses to the second portion 145 that have been performed since an access operation to another portion has been performed, such as an access operation to the first portion 144 or to the third portion 146. The access operation tracking circuit 150 may be configured to compare one or more values of counters in the set of access operation counters 160 to one or more thresholds, such as a threshold 152. In response to the one or more counter values exceeding the threshold 152, the access operation tracking circuit 150 may be configured to initiate a remedial action 154.

In response to the counter value exceeding the threshold 152 due to the access operation 170 to the second portion 145, the access operation tracking circuit 150 may initiate the remedial action 154 that includes scheduling a data move operation from the second portion 145 to another portion of the non-volatile memory 104. For example, the access operation tracking circuit 150 may cause an address of the second portion 145 to be added to a data move schedule 158 to be processed by the controller 120 to perform the data move operation. As another example, the access operation tracking circuit 150 may be configured to initiate sending a data move instruction to the memory die 103 rather than scheduling the data move operation via the data move schedule 158.

In another embodiment, the remedial action 154 may include at least one of scheduling the first portion 144 for a garbage collection operation 156 or lowering a priority of the second portion 145 to be selected for the garbage collection operation 156. For example, the garbage collection operation 156 may be performed by the controller 120 during a background operation or during a period of relatively little user activity at the data storage device 102. The garbage collection operation 156 may be configured to copy valid data from one or more portions of the non-volatile memory 104 (e.g., from one or more source blocks) into an unused portion of the non-volatile memory 104, such as into a free block, enabling the source blocks to be invalidated, erased, or otherwise rendered available for re-use.

In another embodiment, the remedial action 154 includes increasing a priority of the second portion 145 for a data move operation to move data from the second portion 145 to another portion of the non-volatile memory 104. In another embodiment, the remedial action 154 includes generating an estimated error rate of data in the second portion 145 and refreshing the data in the second portion 145 in response to the estimated error rate exceeding an error threshold. For example, data or a sample of data stored in the second portion 145 may be read from the second portion 145 and provided to an ECC engine 122. An estimated error rate for the second portion 145 may be generated at the ECC engine 122 and provided to the access operation tracking circuit 150. The access operation tracking circuit 150 may compare the estimated error rate to an error threshold to determine whether an imbalance of access operations to the first portion 144 as compared to the second portion 145 has resulted in accumulated bit errors due to erase disturb. For example, the ECC engine 122 may generate an estimated error rate based on a number of corrected errors, based on an estimated a bit error rate (BER) or an estimated number of errors (e.g., by generating a syndrome value indicating a number of parity check equations that are unsatisfied), based on a length of time corresponding to a decoding operation (e.g., the greater the number of errors, the more time decoding takes), and/or based on a number of bit values that change during a decoding operation, as illustrative, non-limiting examples.

The set of access operations counters 160 includes multiple counters, each of which may indicate a count of access operations for one of the portions of the non-volatile memory 104 with reference to another one of the portions of the non-volatile memory 104. For example, a first pair of counters 161, 162 corresponds to the first portion 144. A second pair of counters 163, 164 corresponds to the second portion 145, and a third pair of counters 165, 166 corresponds to the third portion 146. An access operation performed at one of the portions 144-146 results in the access operation tracking circuit 150 updating one or more values of the counters 161-166. For example, in response to an access operation 170 being performed at the first portion 144, the first counter corresponding to the second portion 163 may be incremented to indicate that the first portion 144 has had an increase in a number of access operations since the last access operation to the second portion 145. In contrast, when an access operation is performed at the second portion 145, the second counter corresponding to the first portion 162 and the first counter corresponding to the third portion 165 may also be incremented, indicating a relative increase in the number of access operations to the second portion 145 as compared to the first portion 144 and the third portion 146. As another example, when the third portion 146 experiences an access operation, the second counter corresponding to the second portion 164 may be incremented. In addition, when any of the portions 144-146 experiences an access operation, the pair of counters corresponding to the portion may be reset.

In a particular embodiment, the access operation tracking circuit 150 may be configured to maintain a balance, within a threshold, of program and erase (P/E) cycles between adjacent portions of the non-volatile memory 104. For example, the access operation tracking circuit 150 may associate two counters of the set of access operation counters 160 with each portion 144-146 in the non-volatile memory 104. The associated counters may be denoted as a first counter for a first adjacent block and a second counter for a second adjacent block, referred to herein as "CL" (Left) and "CR" (Right). When a target block is being accessed (e.g., either programmed via a write operation or erased via an erase operation), then the CL of the block to the right of the target block and the CR of the block to the left of the target block are both incremented. Further, the CL and CR counters of the target block are reset (e.g., set to 0). When a target block is to undergo a write or an erase operation, then the CR of the block to the left of the target block and the CL of the block to the right of the target block are tested against a threshold, such as the threshold 152. If either counter value has exceeded the threshold, then the corresponding block may be marked for a remedial action 154, such as static folding (e.g., via a data move schedule 158).

Although the terms left and right are used in description of a particular example of operation of the access operation tracking circuit 150 and other embodiments, the labels left and right are arbitrary and could instead be labels such as up and down, 0 and 1, or any other pair of labels to represent a distinction between neighboring physical blocks relative to a particular block.

In some embodiments, updating the set of access operation counters 160 and testing of one or more values of the counters 161-166 to the threshold 152 may be performed prior to each corresponding access operation 170 being performed to the target portion of the non-volatile memory 104. The remedial action 154 may be scheduled or performed prior to the access operation 170 being performed. In other embodiments, the access operation 170 may be performed prior to the remedial action 154 being performed.

During operation, the access operation 170 for a target portion, such as the second portion 145, may be determined. For example, the access operation 170 may be a write operation received from the host 130 where the write operation includes user data 132 to be stored in the second portion 145. The controller 120 may operate the access operation tracking circuit 150 to identify the second portion 145 as a target of the access operation 170, and may update the set of access operation counters 160. In particular, the access operation tracking circuit 150 may cause the first counter corresponding to the second portion 163 and the second counter corresponding to the second portion 164 to be reset, such as to be erased and/or set to 0. In addition, the access operation tracking circuit 150 may cause the second counter corresponding to the first portion 162 and the first counter corresponding to the third portion 165 to each be incremented.

After incrementing the counters 162, 165 and resetting the counters 163, 164, the access operation tracking circuit 150 may compare a modified counter value of the second counter corresponding to the first portion 162 to the threshold 152. In response to determining that the modified counter value exceeds the threshold 152, the access operation tracking circuit may be configured to initiate the remedial action 154. Similarly, in response to determining that a modified counter value of the first counter corresponding to the third portion 165 exceeds the threshold 152, the access operation tracking circuit 150 may initiate the remedial action 154 based on the relative difference of access operations to the third portion 146 as compared to the second portion 145.

By tracking relative counts of write operations (and/or erase operations) to portions of the non-volatile memory 104 relative to adjacent portions of the non-volatile memory 104, the access operation tracking circuit 150 may determine when an imbalance in the number of access operations to one portion since an access operation has been performed to an adjacent portion has reached a magnitude indicative of a beginning of an erase disturb regime, and may perform the remedial action 154 to reduce or prevent occurrences of erase disturb errors. As a result, an error rate of data read from the non-volatile memory 104 may be reduced. Reduction in an error rate of the data read from the non-volatile memory 104 may reduce data read latency. Further, due to reduced processing at the ECC engine 122 of data read from the non-volatile memory 104, a corresponding reduction in power consumption and enhanced user experience with the data storage device 102 may be achieved.

Figure 2:
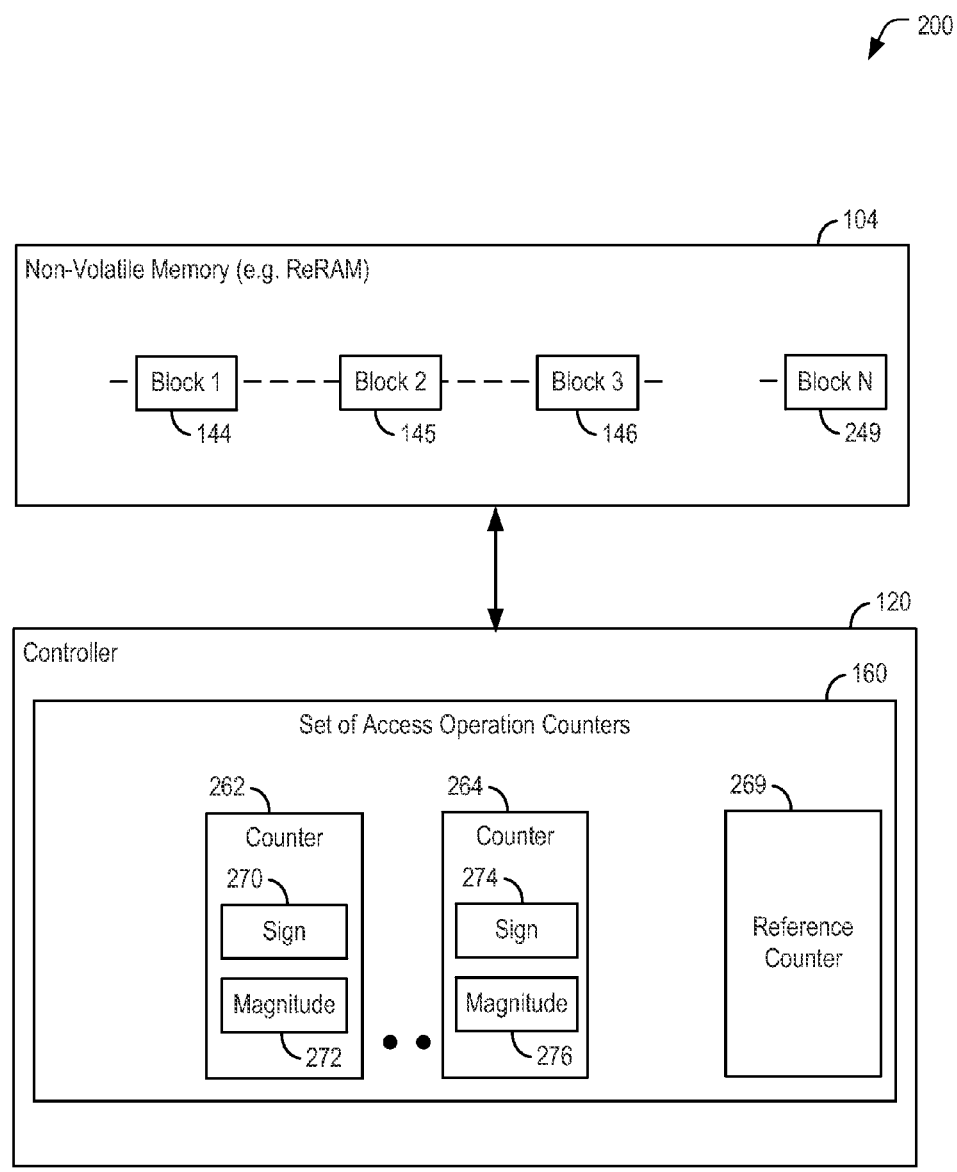
FIG. 2 is a block diagram illustrating a particular embodiment of components that may be incorporated in the data storage device of FIG. 1.

Referring to FIG. 2, another particular embodiment of a system to track access operations to portions of a non-volatile memory is depicted and generally designated 200. The non-volatile memory 104 includes the first portion 144, the second portion 145, and the third portion 146, and is further illustrated as including an Nth portion 249. As illustrated, the Nth portion 249 may correspond to a highest address block of the non-volatile memory 104. However, in other embodiments, the Nth portion 249 may correspond to a lowest address block (e.g., N=0) or any other block within the non-volatile memory 104.

The set of access operation counters 160 includes a first counter 262, a second counter 264, and a reference counter 269. The counters 262, 264 correspond to pairs of adjacent blocks of the non-volatile memory 104. For example, when each of the portions 144-146 corresponds to blocks of the non-volatile memory 104, each of the counters 262, 264 corresponds to pairs of adjacent blocks. To illustrate, the first counter 262 has a counter value that indicates the most recently accessed one of the first portion 144 and the second portion 145 and further indicates a count of accesses to the most recently accessed one of the first portion 144 or the second portion 145 relative to the other one of the first portion 144 or the second portion 145. For example, the counter value of the first counter 262 includes a sign 270 and a magnitude 272. The sign 270 being negative indicates that the first portion 144 is the most recently accessed portion of the two portions 144 and 145. In contrast, the sign 270 being positive indicates that the second portion 145 is the most recently accessed portion. Similarly, the second counter 264 corresponds to the second portion 145 and the third portion 146, and indicates which of the portions 145, 146 was most recently accessed and how many accesses have occurred to that portion relative to the other portion. For example, the second counter 264 also has a sign 274 and a magnitude 276, with the sign 274 being negative indicating that the second portion 145 is the most recently accessed portion, and the sign 274 being positive indicating that the third portion 146 is the most recently accessed portion. Each of the magnitudes 272, 276 indicates a number of accesses that has occurred to the most recently accessed portion since a last access to the other portion tracked by the respective counter.

The set of access operation counters 160 also includes a reference counter 269. The reference counter tracks a number of accesses to a particular block of non-volatile memory 104, such as to the Nth portion 249. The set of counters 262, 264 corresponding to differences between adjacent portions of the non-volatile memory 104 and the reference counter 269 may be used to determine actual (i.e., non-related) program erase counts of blocks of the non-volatile memory 104 for use during wear leveling, as described further below. However, although FIG. 2 includes the reference counter 269, in other implementations the reference counter 269 may be omitted, such as when the set of access operation counters 160 is not also used for wear leveling. Further, although. FIGS. 1-2 illustrate the access operation tracking circuit 150 and the set of access operation counters 160 in the controller 120, in other implementations one or more of the access operation tracking circuit 150 and the set of access operation counters 160 may be in the non-volatile memory 104

In conjunction with the system 200 of FIG. 2, in a first illustrative example, a counter N (where N is an integer) may be defined as "monitoring" a difference between a first block (BLK_B) and a second block (BLK_B+1), such as the counter 262 of FIG. 2 corresponding to the first portion 144 and the second portion 145. When X blocks (where X is an integer greater than 1) are arranged in a linear sequence, X−1 counters may be used.

A positive or negative value of the counter N may indicate which of the first block (BLK_B) and a second block (BLK_B+1) was the last block (e.g., a most recent block) accessed of the first block (BLK_B) and a second block (BLK_B+1). For example, a positive value of the counter N may indicate that the second block (BLK_B+1) being the last block accessed, and a negative value of the counter N may indicate the first block (BLK_B) being the last block accessed. It is noted that one block being indicated based on the positive value and another block being indicated based on the negative value is arbitrary, and can be reversed in other implementations.

The counter N may be initialized to any value, such as a value of −1, 0, or +1. In some implementations, the counter N may not have the value of zero, except in situations where the counter N is initialized to 0.

When a particular block (e.g., either of the first block (BLK_B) or the second block (BLK_B+1)) is accessed, a determination is made which of the first block (BLK) or the second block (BLK_B+1) was last accessed based on a value of a sign of the counter N. If the value of the sign indicates the particular block accessed is the last block accessed between the first block (BLK_B) and the second block (BLK_B+1), an absolute value (e.g., a magnitude) of the counter N may be incremented and the sign of the counter N remains unchanged. If the value of the sign indicates the particular block accessed is not the last block accessed between the first block (BLK_B) and the second block (BLK_B+1), an absolute value (e.g., a magnitude) of the counter N may be set to a value of 1 and a value of the sign may be inverted (e.g., changed from positive to negative or from negative to positive).

After (or before) each access of the particular block, an absolute value of any counter associated with the accessed block may be checked (e.g., compared) to a threshold value, as described further herein.

In a second illustrative embodiment, a counter may be assigned to each set of adjacent blocks of the non-volatile memory 104. To illustrate, the non-volatile memory 104 may include a set of blocks, such as a first block (BLK_0), a second block (BLK_1), a third block (BLK_2), and a fourth block (BLK_3). The set of blocks may be positioned such that the first block (BLK_0) is adjacent to the second block (BLK_1), the second block (BLK_1) is adjacent to the third block (BLK_2), and the third block (BLK_2) is adjacent to the fourth block (BLK_3). Accordingly, a first counter (C0) may be assigned to the first block (BLK_0) and the second block (BLK_1), a second counter (C1) may be assigned to the second block (BLK_1) and the third block (BLK_2), and a third counter (C2) may be assigned to the third block (BLK_2) and the fourth block (BLK_3).

When a particular block is assigned to a counter, the counter may either be to the "left" of the particular block or to the "right" of the particular block. When the particular block is assigned to two counters, one counter may be to the "right" of the particular block and another counter may be to the "left" of the particular block. To illustrate, the first counter (C0) may be to the "right" of the first block (BLK_0) and may be to the "left" of the second block (BLK_1), the second counter (C1) may be to the "right" of the second block (BLK_1) and may be to the "left" of the third block (BLK_2), and the third counter (C2) may be to the "right" of the third block (BLK_2) and may be to the "left" of the fourth block (BLK_3).

When a particular block of the set of blocks is "touched" (e.g., accessed via the access operation 170), one or more counters that are assigned to the particular block may be adjusted (e.g., incremented or decremented). For example, the "counter to the left" may be incremented and the "counter to the right" may be decremented. A value of a particular counter represents a difference between a number of times the particular counter's "left" block has been touched and a number of times the particular counter's "right" block has been touched. When an absolute value of the particular counter reaches a high value, an imbalance between the particular counter's "right" block and the particular counter's "left" block may be indicated.

To illustrate, when the second block (BLK_1) is touched (e.g., programmed or erased), the first counter (C0) may be incremented and the second counter (C1) may be decremented. In edge blocks there may be no designation of a "left" counter or a "right" counter and only one counter is incremented (right edge) or decremented (left edge) when a particular block is touched.

Subsequent to (or prior to) the particular block being touched, an absolute value of each counter corresponding to the particular block may be checked (e.g., compared) to a threshold value. In case the threshold is exceeded, the corresponding block may be moved for static folding or set to undergo garbage collection. For example, when the second block (BLK_1) is touched, if $|C1|$>threshold and C1<0, the third block (BLK_2) may be marked to be moved. As another example, if $|C_0|$>threshold and C0>0, the first block (BLK_0) may be marked to be moved. The threshold value may be static (e.g., pre-defined or fixed) or may be dynamic (e.g., changing). For example, the threshold value may be adjusted (e.g., decreased or increased) as a function of a number of P/E cycles.

In a third illustrative example, one or more program/erase (P/E) cycle counters that may be included in a data storage device, such as the data storage device 102 of FIG. 1, for wear leveling may be replaced with an alternative set of counters, such as the first counter (C0), the second counter (C1), and the third counter (C2), and an additional counter (e.g., a reference counter (C_Ref), such as the reference counter 269 of FIG. 2) that includes (e.g., tracks) an absolute number of cycles for a particular block in the data storage device 102 (e.g., in the non-volatile memory 104).

The alternative set of counters may be converted for use as the one or more P/E cycle counters. A difference in absolute P/E cycles between block 'j' and block may be defined as $d_{kj}$, where k>j, and $d_{kj}$ can be computed as follows:

$$d_{kj} = \Sigma_{m=j} c_m^k,$$

where $c_m$ is a counter value for counter m. It is noted that $d_{kj}$ may be a positive or negative value. If $d_{kj}$>0, the difference between the P/E cycles of block 'j' to block 'k' may be $|d_{kj}|=d_{kj}$ and block 'k' may have $d_{kj}$ more cycles than block 'j'.

A wear leveling scheme using the one or more P/E cycle counters may be converted into a scheme using the alternative set of counters (C0-C1) and the additional counter (e.g., the reference counter (C_Ref)) based on using the alternative set of counters (C0-C1) to compute PIE differences between any two counters. The reference counter (C_Ref) may be used to compute an absolute number of P/E cycles for any block. When the reference counter (C_Ref) corresponds to the first block (BLK_0) (e.g., the reference counter (C_Ref) counts an absolute number of PIE cycles of the first block (BLK_0)), an absolute number of P/E cycles for any block can be computed using $P/E(n)=C\_Ref_j+d_{0n}$.

To keep a number of computations small when ordering the blocks according to P/E cycles, a list of blocks (e.g., a list including a number of entries less than a total number of blocks) with lowest number of cycles may be maintained (e.g., by the controller 120 of the data storage device 102). For example, the non-volatile memory 104 may include 10,000 blocks and the list may include 32 items (e.g., entries) that each includes a block number and a corresponding difference in P/E cycles from some reference block (e.g., a middle block). The items (e.g., entries) of the list may be sorted in ascending PIE cycle difference number from the reference block.

As an illustrative example, when a block (e.g., a block 'i') is being erased (or programmed, depending on the implementations, a difference in P/E cycles of the block (e.g., a difference in PIE cycles of the block from a reference block, such as a block 's') may be computed according to the above equation and denoted as $d_{si}$. The value $d_{si}$ may be compared to a particular P/E cycle difference value, such as a minimum P/E cycle difference value in the sorted list. If $d_{si}$ is smaller than a largest P/E cycle difference of the entries in the list, the block 'i' and value of $d_{si}$ may be inserted as an entry to the list (e.g., at a corresponding location of the sorted list) and the largest entry in the list may be discarded. Accordingly, using the alternative set of counters and an additional counter (e.g., a reference counter (C_Ref)), wear leveling may be implemented without requiring additional memory and a limit associated with neighboring blocks to avoid erase disturb may be maintained.

In addition to one or more of the above described embodiments, instead of moving a block immediately, a block may be marked as a high priority block to be moved at a later time and the threshold value may be reduced to allow the write amplification to be reduced. For example, multiple thresholds (e.g., two or more) having different threshold values may be used and each time a different threshold value is crossed, an immediacy and/or effect of an accommodated action (e.g., a remedial action) may be increased.

To illustrate, when a first threshold value is satisfied, a corresponding neighbor block may be added to a first list of blocks having a low priority to be selected for garbage collection or a target block may be added to a second list of blocks for garbage collection. When a second threshold value is satisfied (e.g., the second threshold value is greater than the first threshold value), the block may be identified as a priority block for background static folding. When a third threshold value is satisfied (e.g., the third threshold value is greater than the second threshold value), the block may be identified for immediate move/refresh.

In addition to one or more of the above described embodiments, after a target block is programmed or erased, a bit error rate (BER) estimation may be performed on one or more representative pages of one or more neighboring blocks of the target block. If the BER estimation is high (e.g., greater than a BER threshold), data of a block that generated the high BER estimation may be refreshed. Additionally or alternatively, the BER estimation may be selectively performed on the one or more neighboring blocks, such as in a probabilistic manner (e.g., on blocks more likely to have a high BER estimation).

It is noted that in some non-volatile memories, a block may be programmed without first erasing the block (e.g., each cell may theoretically be programmed independently without having to erase an entire block). Accordingly, in a particular embodiment, any particular block may be "in placed refreshed" by reading pages of the particular block one-by-one and programming the pages to the same location while adjusting one or more counters associated with the block being refreshed. In another particular embodiment, one or more pages of a particular block may be read page-by-page and, for each page, the page may be decoded, erased in the block, and programmed with the reconstructed data (e.g., decoded data) that was read from the page.

In another particular embodiment, when one or more pages are refreshed, the data from each page may be programmed into a different location within the block (e.g., to a different page so that the same data is not programmed back into the same page). To illustrate, 'n' pages of a block may be identified (e.g., n is a positive integer). A first page may be read and decoded. A second page at a location (e.g., an address) where the decoded first page is to programmed may be read and decoded after the first page is decoded. After the second page is read, the data of the decoded first page may be programmed into the location of the second page. For each page of the 'n' pages, decoded data from one page may be stored into a particular location of a next page until an nth page is reached. When the nth page is read and decoded, the decoded data for the nth page may be programmed into a particular location where data was read for the first page. As the 'n' pages of the block are programmed into new locations, a mapping of logical to physical locations may be updated.

In addition to one or more of the above described embodiments, a block to undergo static folding and/or garbage collection may be selected as a block associated with a counter having a maximal value as compared to each counter of a set of counter. Additionally or alternatively, a dynamic list of blocks may be maintained (e.g., maintained by the controller 120 of the data storage device 102). The dynamic list may include a number of entries that is less than a total number of blocks. Each entry of the dynamic list may be associated with a corresponding block and identify counter (e.g., a counter value) associated with the corresponding block. The dynamic list may be sorted based on P/E cycles calculated for each of the blocks included in the list.

Figure 3:
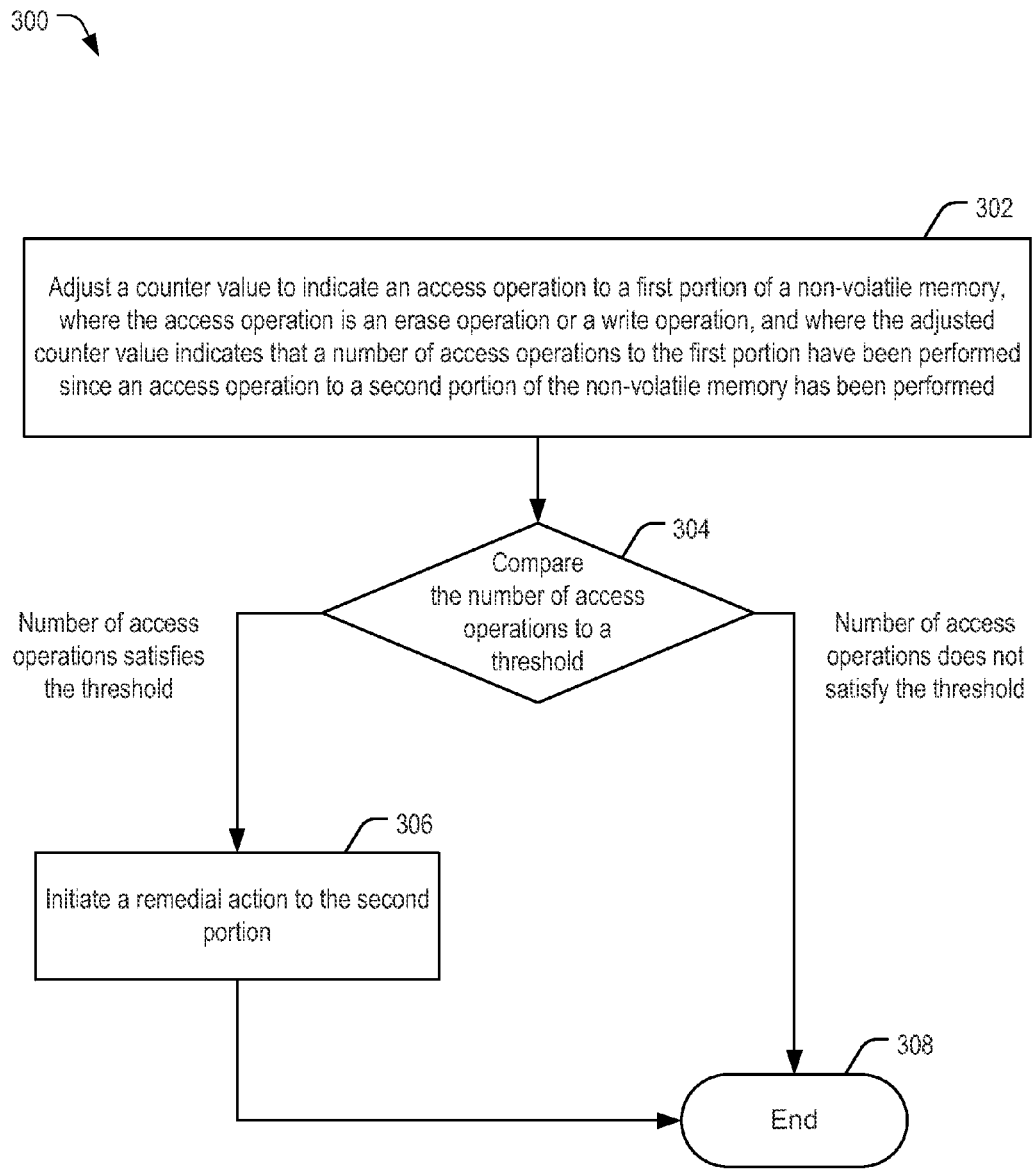
FIG. 3 is a flow chart of a particular illustrative embodiment of a method of mitigating disturb effects that may be performed by the data storage device of FIG. 1.

Referring to FIG. 3, a particular embodiment of a method 300 that may be performed at a data storage device to mitigate disturb effects in a non-volatile memory is depicted. For example, the method 300 may be performed by the controller 120 (e.g., at the access operation tracking circuit 150) of FIG. 1. The data storage device may include or correspond to the data storage device 102 of FIG. 1. The data storage device may include the non-volatile memory, such as the non-volatile memory 104 of FIG. 1.

The method 300 includes adjusting a counter value to indicate an access operation to a first portion of a non-volatile memory, where the access operation is an erase operation or a write operation, and where the adjusted counter value indicates that a number of access operations to the first portion have been performed since an access operation to a second portion of the non-volatile memory has been performed, at 302. The first portion of the non-volatile memory may be adjacent to the second portion of the non-volatile memory. The non-volatile memory may include a resistive random access memory (ReRAM). The first portion may include a first block of the non-volatile memory and the second portion may include a second block of the non-volatile memory that is adjacent to the first block.

The method 300 may also include comparing the number of access operations to a threshold, at 304. When the number of access operations satisfies the threshold, a remedial action may be initiated, at 306. For example, the threshold may be satisfied when the number of access operations is greater than or equal to the threshold. When the number of access operations does not satisfy the threshold, the method 300 may end at 308. For example, the threshold may not be satisfied when the number of access operations is less than the threshold.

In some implementations, the counter value may be adjusted prior to performing the access operation and the remedial action may be performed prior to performing the access operation. In other implementations, the remedial action may be performed after performing the access operation.

In an illustrative embodiment, the data storage device includes a first counter and a second counter corresponding to the first portion and further includes a first counter and a second counter corresponding to the second portion, such as the pairs of counters 161-162 and 163-164 of FIG. 1. The first counter corresponding to the second portion (e.g., the counter 163) may be incremented in response to the access operation to the first portion. The first counter and the second counter corresponding to the first portion (e.g., counters 161 and 162) may be reset in response to the access operation to the first portion. The data storage device may also include a first counter and a second counter (e.g., counters 165 and 166) corresponding to a third portion of the non-volatile memory that is adjacent to the first portion. The second counter corresponding to the third portion may be incremented in response to the access operation to the first portion. For example, when the portion 145 of FIG. 2 is accessed, counters 162 and 165 are incremented and counters 163 and 164 are reset.

In another embodiment, such as depicted in FIG. 2, prior to adjusting the counter value, the counter value indicates a most recently accessed one of the first portion or the second portion and further indicates a count of accesses to the most recently accessed one of the first portion or the second portion relative to the other one of the first portion or the second portion. The count of accesses may indicate a number of accesses to the most recently accessed one of the first portion or the second portion since the other one of the first portion or the second portion was accessed. The counter value may include a sign and a magnitude. The sign being negative may indicate that the first portion is the most recently accessed portion and the sign being positive may indicate that the second portion is the most recently accessed portion. If the sign indicates that the first portion is the most recently accessed portion, adjusting the counter value in response to the access operation may include incrementing the magnitude of the counter value without changing the sign. Alternatively, if the sign indicates that the second portion is the most recently accessed portion, adjusting the counter value in response to the access operation may include resetting the magnitude and changing the sign.

In some implementations, the data storage device may further include a reference counter that tracks a number of accesses to a particular block of the non-volatile memory, such as the reference counter 269 of FIG. 2. The set of counters and the reference counter may be used to determine program/erase counts of blocks of the non-volatile memory. A wear leveling operation may be performed on the non-volatile memory. Candidates for the wear leveling operation may be determined based on counter values of the set of counters and of the reference counter, such as described with respect to FIG. 2.

The remedial action may include scheduling a data move operation of data stored at the second portion to another portion of the non-volatile memory. In other implementations, the remedial action may include generating an estimated error rate of data in the second portion and refreshing the data in the second portion in response to the estimated error rate exceeding an error threshold.

In another implementation, the count of access operations may be compared to multiple threshold values, and a different remedial action may be initiated for each threshold value that is satisfied. For example, the threshold has a first threshold value that is satisfied, the remedial action may include at least one of scheduling the first portion for a garbage collection operation or lowering a priority of the second portion to be selected for the garbage collection operation. When the threshold has a second threshold value that is satisfied (that is greater than the first threshold value), the remedial action may include increasing a priority of the first portion for a data move operation from the first portion to another portion of the non-volatile memory. When the threshold has a third threshold value that is satisfied (that is greater than the second threshold value), the remedial action may include performing the data move operation.

In another implementation, the remedial action includes refreshing data in the second portion. For example, the data in the second portion may be refreshed by reading the data from a location in the second portion, by erasing the data from the location in the second portion, and by programming an error-corrected version of the data to the location in the second portion. To illustrate, data read from the non-volatile memory 104 of FIG. 1 may be sent to the ECC engine 122 and an error-corrected version of the data may be written back to the non-volatile memory 104. As another example, the data in the second portion may be refreshed by reading first data from a first location in the second portion, by programming an error-corrected version of second data to the first location, and by programming an error-corrected version of the first data to a third location in the second portion. The second data may be read from a second location in the second portion. In this example, data in a block may be refreshed, such as a page at a time, where pages are shifted within the block as described with respect to FIG. 2.

A controller configured to perform the method 300 of FIG. 3 may be able to advantageously mitigate disturb effects for a non-volatile memory, such as erase disturb effects of the non-volatile memory 104. Although various components of the data storage device 102 depicted herein are illustrated as block components and described in general teens, such components may include one or more microprocessors, state machines, or other circuits configured to enable the controller 120 and/or the access operation tracking circuit 150 of FIG. 1 to perform operations described herein. One or more aspects of the controller 120 and/or the access operation tracking circuit 150 may be implemented using a microprocessor or microcontroller programmed to perform operations described herein, such as one or more operations of the method 300 of FIG. 3. In a particular embodiment, the controller 120 and/or the access operation tracking circuit 150 includes a processor executing instructions that are stored at the non-volatile memory 104. Alternatively or additionally, executable instructions that are executed by the processor may be stored at a separate memory location that is not part of the non-volatile memory 104, such as at a read-only memory (ROM).

The controller 120 and/or the access operation tracking circuit 150 of FIG. 1 may be implemented using a microprocessor or microcontroller programmed to perform the method 300 of FIG. 3. For example, the microprocessor or microcontroller may be configured to execute instructions (e.g., a series of instructions, such as an algorithm) to perform certain operations described herein. In a particular embodiment, the controller 120 and/or the access operation tracking circuit 150 (e.g., the microprocessor or microcontroller) includes a processor executing instructions that are stored at the non-volatile memory 104. Alternatively or alternatively, executable instructions that are executed by the processor may be stored at a separate memory location that is not part of the non-volatile memory 104, such as at a read-only memory (ROM).

In an illustrative example, the processor may execute the instructions to adjust a counter value to indicate an access operation to a first portion of a non-volatile memory. For example, the processor may determine a physical address associated with the access operation, compare the physical address to one or more physical address ranges to locate a range that includes the physical address, identify a particular counter that corresponds to the identified range, and send a signal to a control input of the identified counter to increment a counter value of the identified counter. The adjusted counter value may indicate that a number of access operations to the first portion have been performed since an access operation to a second portion of the non-volatile memory has been performed. The processor may execute the instructions to selectively initiate a remedial action to the second portion in response to a comparison of the number of access operations to a threshold. For example, the processor may subtract the modified counter value from the threshold, determine whether a sign of the resulting difference is negative, and in response to determining that the sign is negative, the processor may set a flag bit or interrupt signal that indicates that the remedial action is to be performed, while in response to determining that the sign is not negative, the processor may return to processing without initiating the remedial action.

In a particular embodiment, the data storage device 102 may be attached to, or embedded within, one or more host devices, such as within a housing of a portable communication device. For example, the data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices. For example, the data storage device 102 may be a removable device such as a Universal Serial Bus (USB) flash drive or a removable memory card, as illustrative examples. In a particular embodiment, the non-volatile memory 104 includes a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. The illustrations are not intended to serve as a complete description of all of the elements and features of apparatus and systems that utilize the structures or methods described herein. Other embodiments may be utilized and derived from the disclosure, such that structural and logical substitutions and changes may be made without departing from the scope of the disclosure. Although specific embodiments have been illustrated and described herein, it should be appreciated that any subsequent arrangement capable of achieving the same or similar purpose or functionality may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. Accordingly, the disclosure and the figures are to be regarded as illustrative rather than restrictive.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a non-volatile memory, wherein a first portion of the non-volatile memory is adjacent to a second portion of the non-volatile memory; and
a controller configured to adjust a counter value to indicate a count of access operations directed to the first portion, wherein the each access operation changes a logical value of at least one memory cell of the first portion, and wherein the adjusted counter value indicates a number of the access operations to the first portion that have been performed since an access operation to the second portion has been performed, and
wherein the controller is configured to selectively initiate a remedial action to the second portion in response to a comparison of the number of the access operations to a threshold.

2. The data storage device of claim 1, wherein the non-volatile memory includes a resistive random access memory (ReRAM).

3. The data storage device of claim 1, wherein the first portion includes a first block of the non-volatile memory, and wherein the second portion includes a second block of the non-volatile memory that is adjacent to the first block.

4. The data storage device of claim 1, further comprising a first counter and a second counter corresponding to the first portion and a first counter and a second counter corresponding to the second portion, wherein the controller is configured to increment the first counter corresponding to the second portion in response to the access operation to the first portion, and wherein the controller is configured to reset the first counter and the second counter corresponding to the first portion in response to the access operation to the first portion.

5. The data storage device of claim 1, wherein the counter value indicates a most recently accessed one of the first portion or the second portion and further indicates a count of accesses to the most recently accessed one of the first portion or the second portion relative to the other one of the first portion or the second portion.

6. The data storage device of claim 5, wherein the count of accesses indicates a number of accesses to the most recently accessed one of the first portion or the second portion since the other one of the first portion or the second portion was accessed.

7. The data storage device of claim 6, wherein the counter value includes a sign and a magnitude, wherein the sign being negative indicates that the first portion is the most recently accessed portion, wherein the sign being positive indicates that the second portion is the most recently accessed portion, and wherein the controller is configured to adjust the counter value in response to the access operation by:
if the sign indicates that the first portion is the most recently accessed portion, incrementing the magnitude of the counter value without changing the sign; and
if the sign indicates that the second portion is the most recently accessed portion, resetting the magnitude and changing the sign.

8. The data storage device of claim 5, further comprising:
a set of counters that correspond to pairs of adjacent blocks of the non-volatile memory; and
a reference counter configured to track a number of accesses to a particular block of the non-volatile memory, wherein the controller is configured to use the set of counters and the reference counter to determine program/erase counts of blocks of the non-volatile memory.

9. The data storage device of claim 8, wherein the controller is configured to determine candidates for a wear leveling operation based on counter values of the set of counters and of the reference counter.

10. The data storage device of claim 1, wherein the remedial action is associated with a data move operation of data stored in the non-volatile memory.

11. The data storage device of claim 10, wherein the data move operation includes moving data from the second portion to another portion of the non-volatile memory, and wherein the controller is configured to adjust the counter value and to perform the remedial action prior to performing the access operation.

12. The data storage device of claim 10, wherein the remedial action includes scheduling the data move operation, and wherein the controller is configured to perform the remedial action after performing the access operation.

13. The data storage device of claim 10, wherein the data move operation is associated with a garbage collection operation, wherein the threshold has a first threshold value, and wherein the remedial action includes at least one of scheduling the first portion for the garbage collection operation or lowering a priority of the second portion to be selected for the garbage collection operation.

14. The data storage device of claim 13, wherein the threshold has a second threshold value that is greater than the first threshold value, and wherein the remedial action includes increasing a priority of the first portion for a data move operation from the first portion to another portion of the non-volatile memory.

15. The data storage device of claim 14, wherein the threshold has a third threshold value that is greater than the second threshold value, and wherein the remedial action includes performing the data move operation.

16. The data storage device of claim 10, wherein the remedial action includes generating an estimated error rate of data in the second portion, and wherein the data move operation includes refreshing the data in the second portion in response to the estimated error rate exceeding an error threshold.

17. The data storage device of claim 10, wherein the remedial action includes refreshing data in the second portion by:
reading the data from a location in the second portion;
performing an erase operation at the location in the second portion; and
programming an error-corrected version of the data to the location in the second portion.

18. The data storage device of claim 10, wherein the remedial action includes refreshing data in the second portion by:
reading first data from a first location in the second portion;
programming an error-corrected version of second data to the first location, wherein the second data is read from a second location in the second portion; and
programming an error-corrected version of the first data to a third location in the second portion.

19. A device comprising:
a non-volatile memory including a first portion and a second portion; and
a controller configured to, after initializing a counter in response to an operation directed to the second portion, adjust the counter based on accesses to the first portion, wherein each of the accesses is an erase or a write, and wherein the counter indicates a number of the accesses that have occurred since the operation, and to initiate a remedial action to the second portion based on a comparison of the number of the accesses to a threshold.

20. The device of claim 10, wherein a logical value of at least one memory cell of the second portion is changed in response to the operation, and wherein a logical value of at least one memory cell of the first portion is changed in response to each of the accesses, and further comprising:
a memory die into which the non-volatile memory and the controller are integrated.

21. The device of claim 19, wherein the non-volatile memory includes a resistive random access memory (ReRAM).

22. The device of claim 19, wherein the first portion includes a first block of the non-volatile memory, and wherein the second portion includes a second block of the non-volatile memory that is adjacent to the first block.

23. The device of claim 19, further comprising a first counter and a second counter corresponding to the first portion and a first counter and a second counter corresponding to the second portion, wherein the first counter corresponding to the second portion is incremented in response to the access to the first portion, and wherein the first counter and the second counter corresponding to the first portion are reset in response to the access to the first portion.

24. The device of claim 23, further comprising a first counter and a second counter corresponding to a third portion of the non-volatile memory, the third portion adjacent to the first portion, wherein the second counter corresponding to the third portion is incremented in response to the access to the first portion.

25. A method comprising:
in a data storage device including a non-volatile memory, wherein a first portion of the non-volatile memory is adjacent to a second portion of the non-volatile memory, performing:
after determining a threshold, adjusting a counter value to indicate a count of access operations directed to the first portion, wherein each of the access operations is an erase operation or a write operation, and wherein the adjusted counter value indicates a number of the access operations to the first portion that have been performed since an access operation to the second portion has been performed; and
selectively initiating a remedial action to the second portion in response to a comparison of the number of access operations to the threshold.

26. The method of claim 25, wherein prior to adjusting the counter value, the counter value indicates a most recently accessed one of the first portion or the second portion and further indicates a count of accesses to the most recently accessed one of the first portion or the second portion relative to the other one of the first portion or the second portion.

27. The method of claim 26, wherein the count of accesses indicates a number of accesses to the most recently accessed one of the first portion or the second portion since the other one of the first portion or the second portion was accessed.

28. The method of claim 27, wherein the counter value includes a sign and a magnitude, wherein the sign being negative indicates that the first portion is the most recently accessed portion, wherein the sign being positive indicates that the second portion is the most recently accessed portion, and wherein adjusting the counter value is performed in response to the access operation and includes:
if the sign indicates that the first portion is the most recently accessed portion, incrementing the magnitude of the counter value without changing the sign; and
if the sign indicates that the second portion is the most recently accessed portion, resetting the magnitude and changing the sign.

29. The method of claim 25, further comprising determining program/erase counts of portions of the non-volatile memory using a set of counters that correspond to pairs of adjacent portions of the non-volatile memory and using a reference counter, wherein the counter value is stored in the set of counters, and wherein the reference counter tracks a number of accesses to a particular portion of the non-volatile memory.

30. The method of claim 29, further comprising performing a wear leveling operation, wherein candidates for the wear leveling operation are determined based on counter values of the set of counters and based on the reference counter.

31. The method of claim 25, wherein the remedial action is associated with a data move operation of data stored in the non-volatile memory.

32. The method of claim 31, wherein the counter value is adjusted prior to performing the access operation, wherein the remedial action is performed prior to performing the access operation, and wherein the data move operation includes moving data from the second portion to another portion of the non-volatile memory.

33. The method of claim 31, wherein the remedial action includes scheduling the data move operation, and wherein the remedial action is performed after performing the access operation.

34. The method of claim 31, wherein the data move operation is associated with a garbage collection operation, wherein the threshold has a first threshold value, and wherein the remedial action includes at least one of scheduling the first portion for the garbage collection operation or lowering a priority of the second portion to be selected for the garbage collection operation.

35. The method of claim 34, wherein the threshold has a second threshold value that is greater than the first threshold value, and wherein the remedial action includes increasing a priority of the first portion for a data move operation from the first portion to another portion of the non-volatile memory.

36. The method of claim 35, wherein the threshold has a third threshold value that is greater than the second threshold value, and wherein the remedial action includes performing the data move operation.

37. The method of claim 31, further comprising generating an estimated error rate of data in the second portion, wherein the data move operation includes refreshing the data in the second portion in response to the estimated error rate exceeding an error threshold.

38. The method of claim 25, wherein each of the access operations changes a logical value of at least one memory cell of the first portion, and wherein the remedial action is initiated in response to the number of access operations exceeding the threshold.

* * * * *